US005216291A

United States Patent [19]

Seevinck et al.

[11] Patent Number: 5,216,291

[45] Date of Patent: Jun. 1, 1993

[54] BUFFER CIRCUIT HAVING HIGH STABILITY AND LOW QUIESCENT CURRENT CONSUMPTION

[75] Inventors: Evert Seevinck, Eindhoven, Netherlands; Philip D. Costello, Sunnyvale, Ireland

[73] Assignee: U.S. Philips Corp., New York, N.Y.

[21] Appl. No.: 690,445

[22] Filed: Apr. 23, 1991

[30] Foreign Application Priority Data

Apr. 27, 1990 [NL] Netherlands ........................ 9001017

[51] Int. Cl.[5] ............................................ H03K 3/01

[52] U.S. Cl. .............................. 307/296.6; 307/296.8; 307/572; 330/253

[58] Field of Search ............... 307/296.1, 296.6, 296.8, 307/475, 572, 359; 330/253, 259

[56] References Cited

U.S. PATENT DOCUMENTS

| | | | |
|---|---|---|---|
| 3,896,317 | 7/1975 | Alcorn et al. | 307/296.1 |
| 4,380,706 | 4/1983 | Wrathall | 307/296.6 |
| 4,871,978 | 10/1989 | Galbraith | 330/253 |
| 5,030,922 | 7/1991 | Rumreich et al. | 330/253 |

*Primary Examiner*—William L. Sikes
*Assistant Examiner*—Toan Tran
*Attorney, Agent, or Firm*—Steven R. Biren

[57] ABSTRACT

A buffer circuit for buffering an applied reference voltage at a low output impedance. The buffer circuit includes an input transistor which is coupled to an external reference voltage and to an external reference current, and a voltage-to-current converter for applying less or more current to an output terminal of the buffer circuit. This provides a substantially temperature-independent and stable buffer circuit which consumes very little quiescent current.

6 Claims, 1 Drawing Sheet

BUFFER CIRCUIT HAVING HIGH STABILITY AND LOW QUIESCENT CURRENT CONSUMPTION

BACKGROUND OF THE INVENTION

The invention relates to a buffer circuit for applying to an output terminal an output signal which substantially corresponds to a reference voltage.

Such a buffer circuit is used for applying a reference voltage applied to an input terminal in a buffered mode to an output terminal. In this case the buffering consists in providing an output signal which to the best possible extend corresponds to the applied reference voltage value, the output signal being capable of supplying an output current which is many times greater than the current the reference voltage applied to the input terminal can supply. Such a buffer circuit can be used in those cases in which there is a need for a reference voltage source having a high current-producing capacity, for example a supply voltage generator for generating, for example, 3.3 V across an integrated circuit, the supply voltage generator itself being fed by a 5 V supply voltage. In practice, the following, often conflicting requirements are imposed on buffer circuits of this type. They must be capable of correctly driving a load connected to their output, even when the load, considered in time, varies suddenly. They must be capable of supplying a highly variable output current and shall then not evidence a tendency to oscillate. At the same time the dependence on temperature of the buffer circuits must be as low as possible and they must have a lowest possible quiescent current consumption.

SUMMARY OF THE INVENTION

It is inter alia an object of the invention to provide a buffer circuit which has a very low quiescent current consumption but can yet produce a high output current, the buffer circuit being temperature-compensated and not having a tendency to oscillation.

To that end, according to the invention, the buffer circuit is characterized in that the buffer circuit comprises:

an input transistor having a control electrode and a first and a second main electrode, the control electrode being connected to the first input terminal, the first main electrode to the output terminal and the second main electrode to a second input terminal for receiving or supplying a reference current;

a voltage-to-current converter having an input for the reception of a control voltage and an output for supplying an output current which is dependent on the control voltage, the input and the output being connected to the second and the first main electrode, respectively of the input transistor, where the output current decreases or increases, respectively, as a consequence of an increase or a decrease, respectively, of the control voltage.

Since the output terminal of the buffer circuit is without a load, the input transistor carries a constant reference current and the control electrode of the input transistor receives a constant reference voltage, the output terminal assumes a constant reference voltage which depends on the reference current and on the reference voltage and the type of transistor (for example bipolar or field-effect transistor) and its geometrical dimensions. At a fixed chosen value of the reference current and reference voltage, and the type of transistor having been determined, the output terminal thus supplies in the non-loaded state a constant output voltage. If the voltage at the output terminal now slightly decreases in response to a decrease in the current by means of a load, the input transistor will be driven to a lesser extent and consequently carry less current. In response thereto the control voltage at the input of the voltage-to-current converter decreases, causing the voltage-to-current converter to apply more output voltage to the output terminal. In response thereto the voltage at the output terminal increases and the initial drop in the voltage due to the load is counteracted. If the voltage at the output terminal increases in response to a reduced load or possibly in response to an excessive output current supplied by the voltage-to-current converter, the input transistor will be driven to a greater extent and conduct more current. In response thereto the control voltage at the input of the voltage-to-current converter increases and the output current of the voltage-to-current converter decreases. This causes also a voltage increase at the output terminal to be counteracted. This provides a buffer circuit which supplies a constant voltage from its output terminal. The quiescent current consumption of the buffer circuit of the invention is very low, since the value of the reference current can be chosen to be very low and basically is independent of the current-supplying capacity of the voltage-to-current converter. Simulations have proved that a buffer circuit in accordance with the invention is free from oscillations and highly independent of temperature.

An embodiment of a buffer circuit of the invention is characterized in that the voltage-to-current converter comprises a control transistor and a current mirror, an input circuit of the current mirror being incorporated in a main current path of the control transistor, and an output circuit of the current mirror being connected to the output of the voltage-to-current converter, the input of the voltage-to-current converter being connected to a control electrode of the control transistor.

The quantity of current flowing through an input circuit of the current mirror is determined by means of the control transistor. Because of the current mirror action a larger current can be applied to the output terminal via the output circuit of the current mirror. Consequently the current through the input circuit of the current mirror can still be chosen to have a low value, as a result of which the quiescent current consumption is very low. Such a voltage-to-current converter in the buffer circuit in accordance with the invention provides a very stable buffer circuit which has no or hardly any tendency to oscillate.

BRIEF DESCRIPTION OF THE DRAWING

The invention will now be described in greater detail with reference to embodiments shown in the accompanying drawing, in which.

DESCRIPTION OF THE PREFERRED EMBODIMENTS

Figure 1:
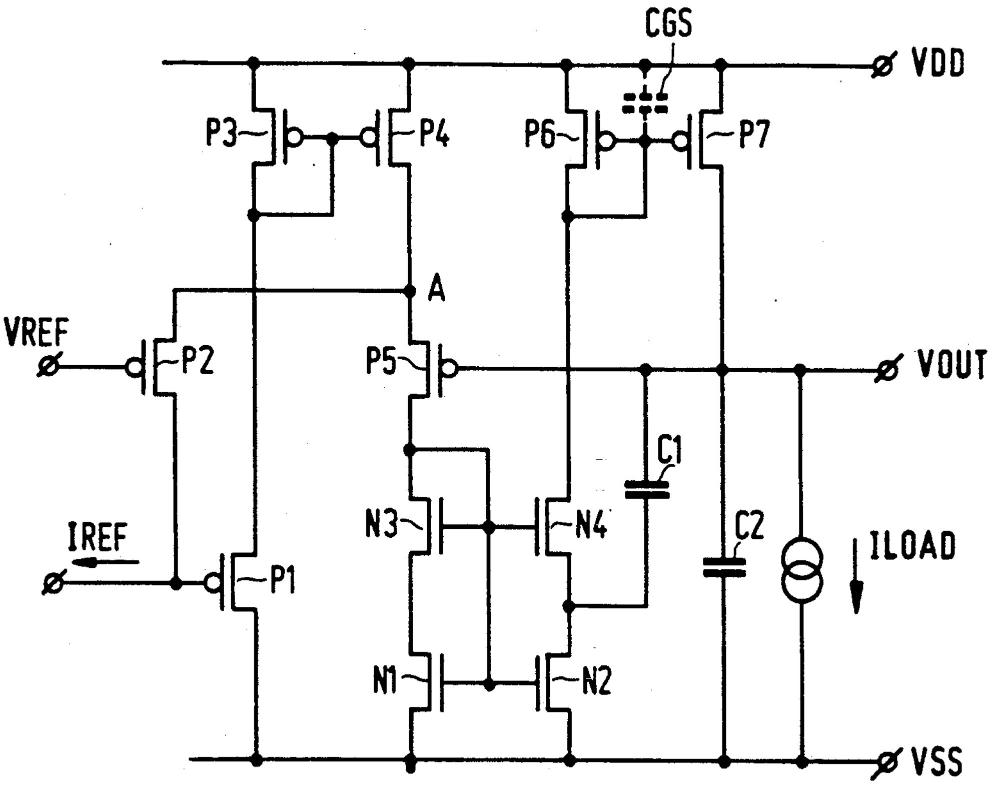
FIG. 1 shows an embodiment of a buffer circuit in accordance with the invention.

FIG. 1 shows an embodiment of a buffer circuit of the invention. The buffer circuit comprises PMOS-transistors P1 to P7, NMOS-transistors N1 to N4 and two capacitive elements C1 and C2. The gate of PMOS-transistor P1 is connected to an input terminal for the reception (or the supply) of a reference current IREF, while the drain and source of transistor P1 is connected to the first supply terminal VSS and to the drain of PMOS-transistor P3. The gate of transistor P3 are connected respectively to its drain and to the gate of PMOS-transistor P4. The sources of transistors P3 and P4 are connected to the second supply terminal VDD. The gate of PMOS-transistor P2 is connected to a first input terminal for the reception of an applied reference voltage VREF. The source and drain of transistor P2 is connected to the drain of transistor P4 and to the gate of transistor P1. The drain of transistor P4 is connected to a junction point A (output terminal) and to the source of PMOS-transistor P5. The drain of transistor P5 is connected to the drain and gate of NMOS-transistor N3 and to the gates of NMOS-transistors N1, N2 and N4. The source of transistor N3 is connected to the drain of transistor N1 and the sources of transistors N1 and N2 are connected to the first supply terminal VSS. The drain of transistor N2 is connected to the source of transistor N4 and the drain of transistor N4 is connected to the drain of PMOS-transistor P6. The sources of PMOS-transistors P6 and P7 are connected to the second supply terminal VDD. The gates of transistors P6 and P7 are interconnected and connected to the drain of transistor P6. The drain of transistor P7 is connected to an output terminal VOUT (further output terminal) and to the gate of transistor P5. A capacitive element C1 is arranged between output terminal VOUT and the common junction point of transistors N2 and N4. Capacitive element C2 and current source ILOAD schematically illustrate, by means of a capacitance C2 and a user current ILOAD, a load to be connected.

The circuit shown in FIG. 1 operates as follows. At its gate transistor P2 receives a reference voltage VREF and the transistor carries a reference current IREF. Since the gate-source voltage VGS of transistor P2 depends on its main current, junction point A assumes a voltage equal to VREF plus the gate-source voltage of transistor P2. If now, due to a load, the voltage across junction point A decreases (via transistors P5, N3 and N1 to power supply terminal VSS), the value of the gate-source voltage of PMOS-transistor P2 decreases, as a result of which transistor P2 carries less current. As a result thereof, the reference current IREF is not obtained in its totality from transistor P2, but partly from the gate of transistor P1. This causes the voltage at the gate of transistor P1 to decrease, in response to which PMOS-transistor P1 starts to conduct more main current. By a current mirror action, which is known per se, of transistors P3 and P4 a greater current is also applied to junction point A and an initial drop of the voltage at this junction point because of an increase in the load is counteracted. Thus, transistors P1, P3 and P4 form a voltage-to-current converter. When the voltage across junction point A increases in response to a decrease in the load, the gate-source voltage of transistor P2 increases as a result of which this transistor starts to conduct more current. Consequently, the gate of transistor P1 will be charged, as the current through the transistor P2 exceeds the reference current IREF, causing the gate-source voltage of transistor P1 to increase. In response thereto, transistor P1 will cause less main current to be conducted and, owing to the current mirror action of transistors P3 and P4 less current will be applied to junction point A, an initial increase in voltage across junction point A being counteracted thereby. So junction point A yields a voltage which is substantially constant and has a value of VREF plus the gate-source voltage of transistor P2, which gate-source voltage is substantially constant with the aid of a constant current IREF. By incorporating transistors P1, P3 and P4 in the buffer circuit of the invention, any voltage increase or decrease at junction point A is counteracted, so that junction point A generates a constant voltage having a low output impedance.

According to the invention, it is alternatively possible to use, instead of junction point A, a further output VOUT, which is controlled by additional transistors N1 to N4, P6 and P7, as is shown in FIG. 1, as the power supply source. At a decrease of the voltage at the output terminal VOUT in response to an increased load, the gate-source voltage difference of transistor P5 becomes larger (the voltage across junction point A is constant, as was described in the preceding paragraph). Consequently, transistor P5 will start to conduct a larger amount of current and with the aid of a current mirror action by transistors N1, N3, N2, N4 and P6, P7, this current is converted into a current to output terminal VOUT. Thus, more current is applied to output terminal VOUT whose voltage increases in response thereto. When the voltage at output terminal VOUT increases, transistor P5 will cause less current to flow as a result of which less current will be applied to output terminal VOUT because of the said current mirror action. This counteracts an increase in voltage. Thus, output terminal VOUT supplies a stabilized output voltage having a low impedance value, this output voltage, in contradistinction to the voltage at junction point A, being substantially equal to the reference voltage VREF. In practice the buffer circuit shown in FIG. 1 was found to be temperature-independent to a very large extent and the circuit is very stable as regards tendencies to oscillate.

Capacitive element C1 greatly accelerates the speed of response of the buffer circuit of the invention to rapidly varying loads and also significantly increases the stability of the buffer circuit. The element C1 is in the charged state during stable operation of the circuit. When the load at the output terminal VOUT suddenly increases, the output voltage at terminal VOUT will drop somewhat. This voltage drop will be briefly passed on to the source of NMOS-transistor N4, in response to which transistor N4 will temporarily carry a higher current. This temporarily higher current accelerates the discharge of the parasitic gate-source capacitances CGS of PMOS-transistors P6 and P7 as a result of which transistors P6 and P7 will react more rapidly to an increase in the load at the output terminal VOUT. The capacitive element also provides a phase correction on the basis of known Miller capacitance correction methods, which improves the stability of the current to a still further significant extent.

Figure 2:
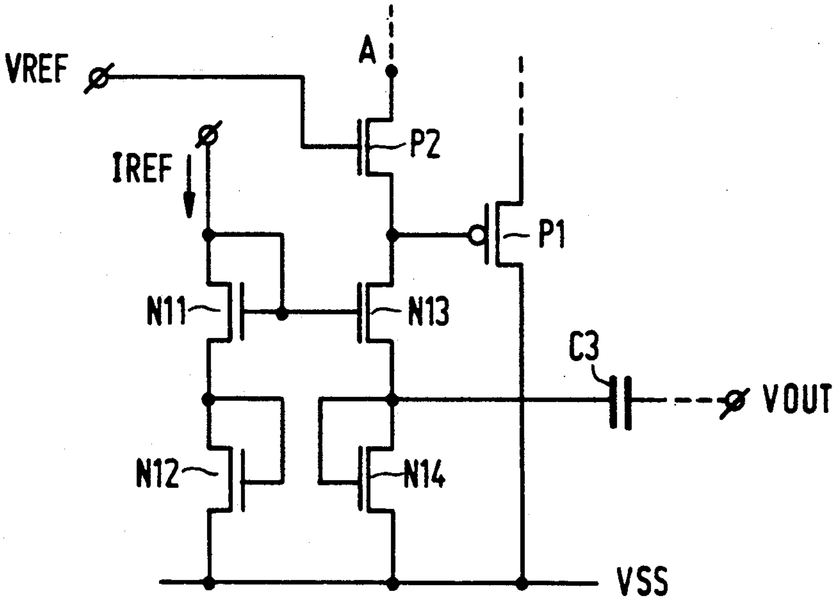
FIG. 2 shows a preferred embodiment of a portion of a buffer circuit of the invention.

FIG. 2 shows a preferred embodiment of a portion of a buffer circuit in accordance with the invention. The circuit shown in FIG. 2 can preferably be used in the buffer circuit as shown in FIG. 1. Elements corresponding to those shown in FIG. 1 have been given the same reference numerals or symbols, as the case may be.

The circuit comprises NMOS-transistors N11 to N14, PMOS-transistors P1 and P2 and capacitive element C3. The drain of transistor N11 is connected to its gate and to the gate of transistor N13 and to a second input terminal for receiving a reference current IREF. The source of transistor N11 is connected to the gate and to the drain of transistor N12. The source of transistor N13 is connected to the gate and to the drain of transistor N14. The sources of transistors N12 and N14 are connected to the first power supply terminal VSS. Capacitive element C3 has one side connected to the source of transistor N13 and its other side to output terminal VOUT of the buffer circuit shown in FIG. 1. The drain of transistor N13 is connected to the gate of transistor P1. The transistors P1 and P2 are connected in the same manner to transistors P3, P5 etcetera as shown in FIG. 1, but for the sake of clearness these transistors have been omitted from the drawing.

The circuit shown in FIG. 2 operates as follows. Transistors N11, N12, N13 and N14 form a current mirror. The current IREF applied by transistors N11 and N12 (in contrast to the circuit in FIG. 1 in which a current IREF is discharged) is mirror-inverted with respect to a current proportional therewith flowing through transistors N13 and N14. Here the capacitive element C3 increases the speed at which the circuit response to sudden voltage changes at output terminal VOUT in response to variations in the load. At a fast increase or drop of the output voltage at output terminal VOUT, such an increase or drop is temporarily passed on to the source of transistor N13. Transistor N13 can then temporarily carry less or more current as a result of which transistor P2 can then be temporarily adjusted to a lower or a higher reference current. This lower or higher reference current is then converted via the further transistors in the circuit of FIG. 1 into a temporarily lower or higher current to output terminal VOUT.

A buffer circuit in accordance with the invention can advantageously be used as a supply voltage generator for generating, for example, a voltage which is lower (for example 3.3 V) than the power supply voltage (for example 5 V) in an integrated circuit.

We claim:

1. A buffer circuit for applying to an output terminal an output signal which substantially corresponds to a reference voltage applied to a first input terminal, characterized in that the buffer circuit comprises:

an input transistor having a control electrode and a first and a second main electrode, the control electrode being coupled to the first input terminal, the first main electrode being coupled to the output terminal and the second main electrode being coupled to a second input terminal for conducting a reference current; and a voltage-to-current converter having an input for the reception of a control voltage and an output for supplying an output current which is dependent on the control voltage, the input and the output being coupled to the second and the first main electrode, respectively, of the input transistor, where the output current decreases or increases, respectively, as a consequence of an increase or a decrease, respectively, of the control voltage, said voltage-to-current converter comprising a control transistor and a current mirror.

2. A buffer circuit as claimed in claim 1, an input circuit of the current mirror being incorporated in a main current path of the control transistor, and an output circuit of the current mirror being coupled to the output of the voltage-to-current converter, the input of the voltage-to-current converter being coupled to a control electrode of the control transistor.

3. A buffer circuit as claimed in claim 2, characterized in that the output terminal of the buffer circuit is coupled to a power supply terminal via a conducting channel of an output transistor and an input circuit of a further current mirror, an output circuit of the further current mirror being coupled to a control electrode of the output transistor and to a further output terminal, for supplying an output signal at the further output terminal which substantially corresponds to a reference voltage applied to the first input terminal.

4. A buffer circuit as claimed in claim 3, characterized in that the input circuit of the further current mirror includes the conducting channel of a first mirror transistor arranged in the circuit as a diode, and the output circuit of the further current mirror includes a second mirror transistor and a third mirror transistor arranged in the circuit as a diode, the third mirror transistor being coupled to a fourth mirror transistor, the fourth mirror transistor being coupled to the output circuit of the further current mirror.

5. A buffer circuit as claimed in claim 4, characterized in that the conducting channel of a fifth mirror transistor is arranged between the second and third mirror transistor, a main electrode of the second mirror transistor being coupled to a main electrode of the fifth mirror transistor via a junction point, a capacitive element being arranged between the junction point and the further output of the buffer circuit.

6. A buffer circuit as claimed in claim 3, characterized in that the second input terminal is coupled to an input circuit of a reference current mirror, an output circuit of which is connected to the control electrode of the control transistor, the output circuit being coupled to the further output of the buffer circuit via a further capacitive element.

* * * * *